(12) United States Patent
Opris et al.

(10) Patent No.: US 10,250,980 B2
(45) Date of Patent: Apr. 2, 2019

(54) DIGITAL MICROPHONE AND CONTROL METHOD THEREFOR

(71) Applicant: Fortemedia, Inc., Santa Clara, CA (US)

(72) Inventors: Ion Opris, San Jose, CA (US); Abu Hena M Kamal, Santa Clara, CA (US); Lee Tay Chew, Cupertino, CA (US); Ramesh Prakash, Fremont, CA (US); Shomo Chen, San Jose, CA (US); Qiang Wei, San Jose, CA (US); Lung-Chu Joseph Chen, Pleasanton, CA (US)

(73) Assignee: FORTEMEDIA, INC., Santa Clara, CA (US)

( * ) Notice: Subject to any disclaimer, the term of this patent is extended or adjusted under 35 U.S.C. 154(b) by 0 days.

(21) Appl. No.: 15/729,796

(22) Filed: Oct. 11, 2017

(65) Prior Publication Data
US 2018/0109875 A1    Apr. 19, 2018

Related U.S. Application Data

(60) Provisional application No. 62/409,912, filed on Oct. 19, 2016.

(51) Int. Cl.
*H04R 3/10* (2006.01)
*H04R 19/04* (2006.01)
(Continued)

(52) U.S. Cl.
CPC ............ *H04R 3/10* (2013.01); *B81B 7/008* (2013.01); *B81B 7/02* (2013.01); *H03F 3/183* (2013.01);
(Continued)

(58) Field of Classification Search
CPC .......... H04R 3/10; H04R 19/04; H03F 3/182; H03G 3/3005; B81B 7/008; B81B 7/02; B81B 2201/0257
See application file for complete search history.

(56) References Cited

U.S. PATENT DOCUMENTS 8,831,246 B2    9/2014  Josefsson
2014/0140538 A1*  5/2014  Kropfitsch ............. H03G 3/002
                                                    381/106
(Continued)

*Primary Examiner* — Sonia L Gay
(74) *Attorney, Agent, or Firm* — McClure, Qualey & Rodack, LLP

(57) ABSTRACT

A digital microphone is provided. The digital microphone includes an acoustic sensor, a bias generator, first and second attenuators, a buffer, an amplifier, an ADC, and a controller. The acoustic sensor transfers an acoustic signal to a voltage signal. The bias generator provides a bias voltage to the acoustic sensor. The first attenuator attenuates the voltage signal by a first attenuation value. The buffer buffers the voltage signal to generate a buffered voltage signal. The amplifier amplifies the buffered voltage signal to generate an amplified signal. The ADC converts the amplified signal to a data signal with a digital format. The second attenuator attenuates the data signal by a second attenuation value. The controller determines whether the amplified signal is larger than a reference value and adjusts the bias voltage and the first and second attenuation values of the first and second attenuators according to the result determined by the controller.

16 Claims, 4 Drawing Sheets

(51) Int. Cl.

| | |
|---|---|
| *H04R 3/04* | (2006.01) |
| *H04R 19/00* | (2006.01) |
| *B81B 7/00* | (2006.01) |
| *B81B 7/02* | (2006.01) |
| *H03F 3/183* | (2006.01) |
| *H03G 3/30* | (2006.01) |

(52) U.S. Cl.
CPC ........... *H03G 3/3005* (2013.01); *H04R 19/04* (2013.01); *B81B 2201/0257* (2013.01); *H04R 3/04* (2013.01); *H04R 19/005* (2013.01); *H04R 2201/003* (2013.01)

(56) References Cited

U.S. PATENT DOCUMENTS

| | | | |
|---|---|---|---|
| 2016/0087576 A1 | 3/2016 | Yurrtas et al. | |
| 2016/0149542 A1* | 5/2016 | Mucha .................. | H04R 3/00 381/111 |
| 2016/0249122 A1* | 8/2016 | Popper .................. | H04R 1/04 |
| 2017/0150253 A1* | 5/2017 | Ravnkilde ............. | H04R 3/002 |
| 2018/0063644 A1* | 3/2018 | Bach .................... | H04R 19/005 |

* cited by examiner

DIGITAL MICROPHONE AND CONTROL METHOD THEREFOR

CROSS REFERENCE TO RELATED APPLICATIONS

This application claims the benefit of U.S. Provisional Application No. 62/409,912, filed on Oct. 19, 2016, the contents of which are incorporated herein by reference.

BACKGROUND OF THE INVENTION

Field of the Invention

The invention generally relates to a digital microphone, and more particularly to a digital microphone with a high dynamic range.

Description of the Related Art

A microelectro-mechanical system (MEMS) microphone typically comprises a diaphragm and a back plate spaced apart from the diaphragm to collectively form a capacitor. The diaphragm vibrates in response to acoustic signals, which causes the capacitance between the diaphragm and the back plate to vary. Typically, the charge on the capacitor remains essentially constant during the vibration, and, thus, the voltage across the capacitor varies as the capacitance varies by incident acoustic signals. The varying voltage may be used to drive a circuit, such as an amplifier or an analog-to-digital converter. In recent years, MEMS microphones have become increasingly popular in portable electronic devices, such as digital cameras and mobile phones. In some cases where a large acoustic signal provided to a MEMS microphone, the diaphragm of the MEMS microphone may reach its absolute displacement limitation, and signals derived from a corresponding voltage generated by the MEMS microphone is clipped, which induces undesirable distortion in these signals and further lowers its dynamic range. Thus, there is an increased demand for MEMS microphones supporting high acoustic overload point (AOP) levels.

BRIEF SUMMARY OF THE INVENTION

An exemplary embodiment of a digital microphone is provided. The digital microphone comprises an acoustic sensor, a bias generator, a first attenuator, a buffer, an amplifier, an analog-to-digital converter, a second attenuator, and a controller. The acoustic sensor senses an acoustic signal and transfers the acoustic signal to a voltage signal. The bias generator provides a bias voltage to the acoustic sensor. The first attenuator is coupled to the acoustic sensor at a first node. The first attenuator attenuates the voltage signal by a first attenuation value. The buffer is coupled to the acoustic sensor at the first node. The buffer receives the voltage signal and buffers the voltage signal to generate a buffered voltage signal. The amplifier is connected to the buffer. The amplifier receives the buffered voltage signal and amplifies the buffered voltage signal to generate an amplified signal. The analog-to-digital converter is connected to the amplifier at a second node. The analog-to-digital converter receives the amplified signal and converts the amplified signal to a data signal with a digital format. The second attenuator is connected to the analog-to-digital converter. The second attenuator attenuates the data signal by a second attenuation value. The controller is connected to the amplifier at the second node. The controller determines whether a magnitude of the amplified signal is larger than a reference value and adjusts the bias voltage, the first attenuation value of the first attenuator, and the second attenuation value of the second attenuator according to a result determined by the controller.

Another exemplary embodiment of a control method for a digital microphone is provided. The control method comprises the steps of providing a bias voltage to an acoustic sensor; transferring an acoustic signal to a voltage signal by the acoustic sensor; attenuating the data signal by a first attenuation value; amplifying the signal to generate an amplified signal according to the voltage signal; converting the amplified signal to a data signal with a digital format; attenuating the data signal by a second attenuation value; determining whether a magnitude of the amplified signal is larger than a reference value; and adjusting a level of the bias voltage, the first attenuation value of the first attenuator, and the second attenuation value of the second attenuator according to a determination result.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of contemplated modes and implementations for carrying out the invention. This description is made for the purpose of illustrating the general principles of the invention and should not be taken in a limiting sense. The scope of the invention is best determined by reference to the appended claims.

Figure 1:
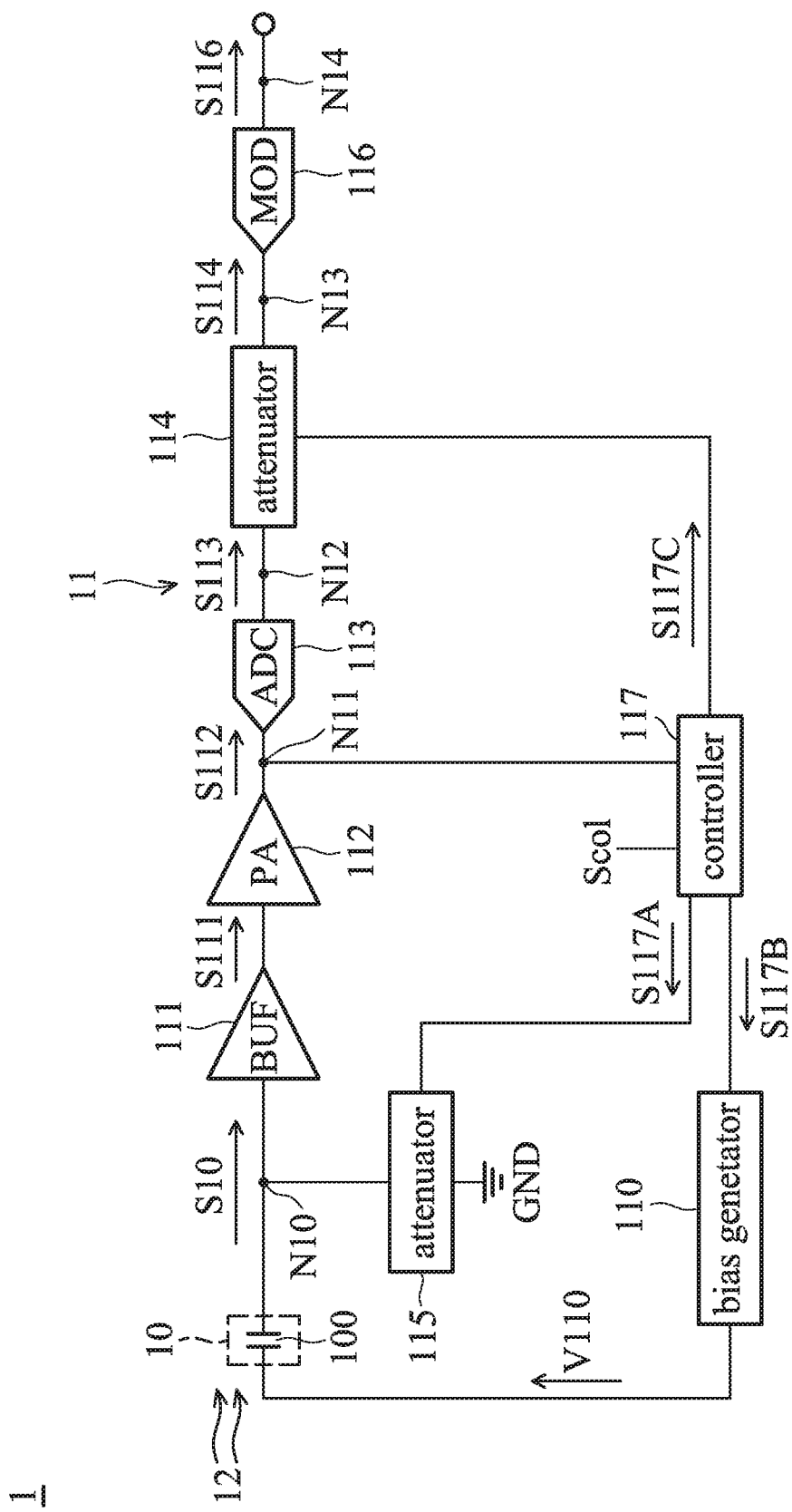
FIG. 1 shows one exemplary embodiment of a digital microphone.

FIG. 1 shows an exemplary embodiment of a digital microphone. As shown in FIG. 1, a digital microphone 1 comprises an acoustic sensor 10 and a readout processor 11 coupled to the acoustic sensor 10. In the embodiment, the readout processor 11 comprises a bias generator 110, a buffer 111, a preamplifier (PA) 112, an analog-to-digital converter (ADC) 113, attenuators 114 and 115, a modulator (MOD) 116, and a controller 117. The elements 110-117 and other elements/circuits included in the processor 11 form an application specific integrated circuit (ASIC). In an embodiment, the acoustic sensor 10 is implemented by a micro-electro-mechanical system (MEMS). In the disclosure, a MEMS sensor is given as an example for the acoustic sensor 10 for illustration. The MEMS sensor 10 senses an incoming acoustic signal 12 and comprises a diaphragm and a back plate spaced apart from the diaphragm to collectively form a capacitor 100. The bias generator 110 is controlled by the controller 117 to supply a bias voltage V110 to the capacitor 100 to keep the charges on the capacitor 100 constant. The level of the bias voltage V110 can be adjusted according to the controlling of the controller 117 to the bias generator 110. The diaphragm vibrates in response to the acoustic signal 12, which causes the capacitance between the diaphragm and the back plate to vary. As the capacitance varies by the incident acoustic signal 12, a corresponding voltage signal S10 is generated at a node N10 coupled to the output terminal of the MEMS sensor 10. According to the above description, the MEMS sensor 10 is used to transfer the acoustic signal 12 to a voltage signal S10. In the embodiment, the sensitivity of the MEMS sensor 10 is affected by the level of the bias voltage V110. When the MEMS sensor 10 is biased with a higher bias voltage V110, the sensitivity of the MEMS sensor 10 is increased; when the MEMS sensor 10 is biased with a lower bias voltage V110, the sensitivity of the MEMS sensor 10 is decreased.

Generally, sensitivity of an acoustic sensor refers to a transfer characteristic of the acoustic sensor which is determined by a relationship between the voltage or current of a signal generated by the acoustic sensor according to a received acoustic signal and the amount of the acoustic energy of the acoustic signal. In the embodiment, the sensitivity of the MEMS sensor 10 is adjustable and determined according to the level of the bias voltage V110 supplied by the bias generator 110. When the bias generator 110 supplies an increased bias voltage to the MEMS sensor 10, the sensitivity of the MEMS sensor 10 increases. On the other hand, when the bias generator 110 supplies a reduced bias voltage to the MEMS sensor 10, the sensitivity of the MEMS sensor 10 reduces.

Referring to FIG. 1, the attenuator 115 is coupled to the output terminal of the MEMS sensor 10 at the node N10. In some cases, the attenuator 115 is configured to attenuate the voltage signal S10, and the attenuation value is controlled by the controller 117. In other some cases, the voltage signal S10 is not attenuated by the attenuator 115, that is, the attenuation value is equal to 0 dB. The buffer 111 is also connected to the output terminal of the MEMS sensor 10 at the node N10. The buffer 111 receives the voltage signal S10 which has been attenuated or has not suffered attenuation. The buffer 111 buffers the voltage signal S10 to generate a buffered voltage signal S111 and provides it to the pre-amplifier 112. The pre-amplifier 112 operates to amplify the buffered voltage signal S111 to generate a corresponding amplified signal S112 at a node N11. In the embodiment, the gain of the pre-amplifier 112 is, for example, 10 dB. The input of the ADC 113 is connected to the output terminal of the pre-amplifier 112 at the node N11 to receive the amplified signal S112. The ADC 113 converts the amplified signal S112 in an analog format to a data signal S113 with a digital format. In an embodiment, the data signal S113 is a 1-bit pulse density modulation (PDM) signal.

The attenuator 114 is connected to the output terminal of the ADC 113 at a node N12 to receive the data signal S113. The attenuator 114 converts the data signal S113 from a 1-bit PDM signal to a 1-bit pulse coded modulation (PCM) and then attenuates the data signal S113 according to an attenuation value controlled by the controller 117. In some cases, the attenuation value is not equal to 0 dB, which means that the attenuator 114 reduces the magnitude of the data signal S113. In other some cases, the data signal S113 is not attenuated by the attenuator 114, that is, the attenuation value is equal to 0 dB. After the attenuation, the attenuator 114 generates an attenuated data signal S114 at a node N13. The modulator 116 is coupled to the node N13 to receive the attenuated data signal S114. The modulator 116 converts the attenuated data signal S114 from a 1-bit PCM signal back to a 1-bit PDM signal and then generates an output digital signal S116 at the output node N14 of the digital microphone 1. The output digital signal S116 serves as the output of the digital microphone 1 to drive external circuitry coupled to the digital microphone 1.

Referring to FIG. 1, the controller 117 is coupled to the node N11 to receive the amplified signal S112 generated by the pre-amplifier 112. The controller 117 compares the magnitude of the amplified signal S112 with a reference value and determines the attenuation values of the attenuators 114 and 115 and the level of the bias voltage V110 according to the comparison result. In other words, the attenuation values of the attenuators 114 and 115 are and the level of the bias voltage V110 are adjusted or controlled according to the amplified signal S112 from the preamplifier 112.

In the following paragraphs, the details of the adjustment and/or determination of the attenuation values of the attenuators 114 and 115 and the level of the bias voltage V110 will be described by referring to FIGS. 2 and 3. According to the embodiment, when the digital microphone 1 starts operating, the bias generator 110 initially supplies the bias voltage V110 with a predetermined level, and the attenuation values of the attenuators 114 and 115 are set by the controller 117 as 0 dB and 20 dB respectively.

Figure 2:
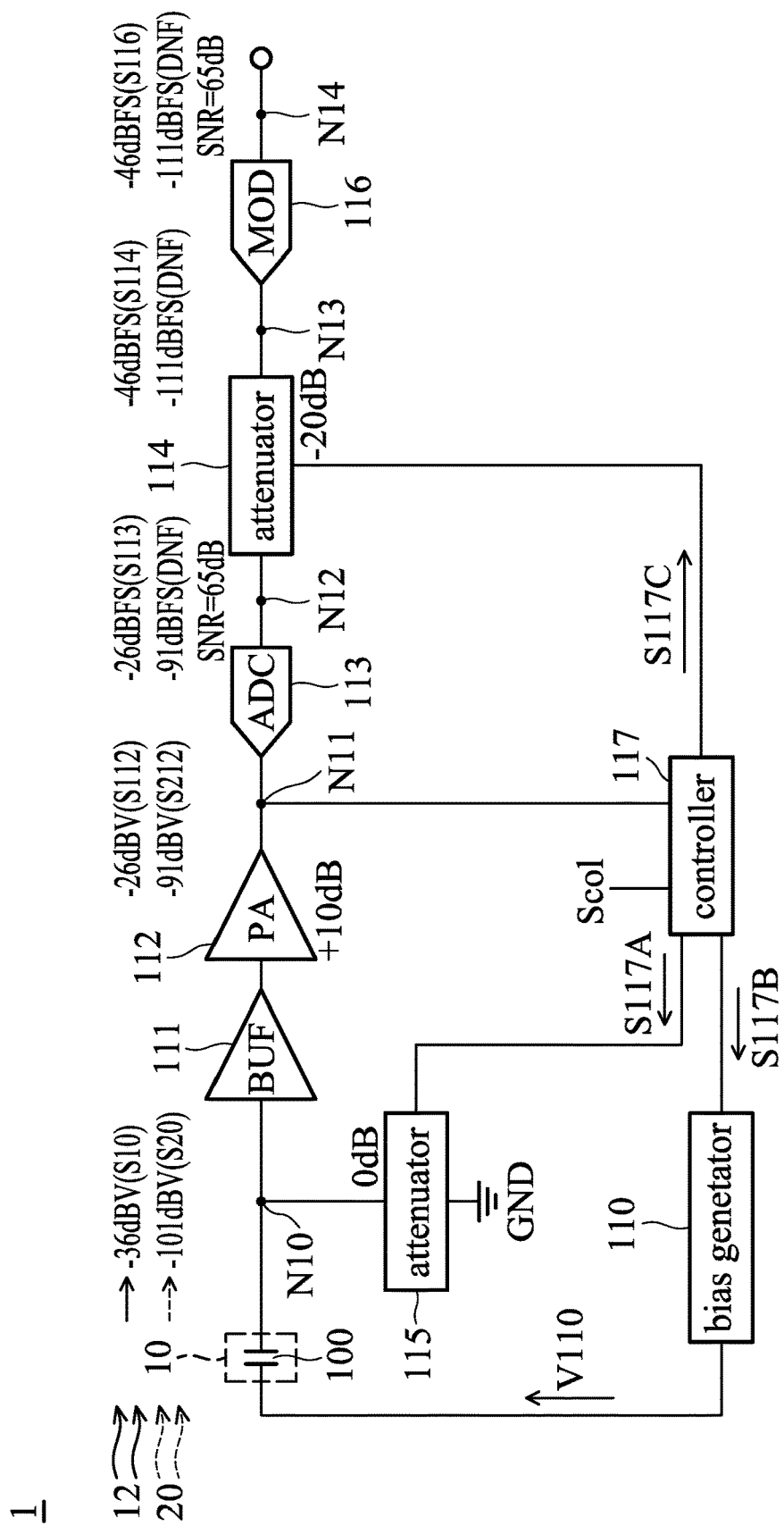
FIG. 2 is schematic view showing an operation of a digital microphone for an acoustic signal with a normal sound-pressure-level (SPL) value.

Referring to FIG. 2, it is assumed that the acoustic signal 12 is a typical sound-pressure-level (SPL) acoustic signal whose pressure level is 94 dBSPL and the MEMS sensor 10 also senses a noise signal 20. In the embodiment, to describe the signal-noise ratio (SNR) of the digital microphone 1, the noise signal 20 is applied to serve as a reference signal. After the transfer operation of the MEMS sensor 10, it is assumed that the magnitude of the voltage signal S10 at the node N10 is −36 dBV, and the magnitude of the noise voltage signal S20 at the node N10, which is transferred from the noise signal 20, is −101 dBV. In this embodiment, since the attenuation value of the attenuator 115 is 0 dB, the magnitude of the voltage signal S10 and the magnitude of the noise voltage signal S20 are not attenuated by the attenuator 115. Through the operation of the preamplifier 112 whose gain is 10 dB, the magnitude the amplified signal S112 at the node N11 (the output terminal of the pre-amplifier 112) is −26 dBV, and the magnitude of the noise signal S212 at the node N11 is −91 dBV. In the embodiment, the gain of the ADC 113 is OdB. Accordingly, after the analog-to-digital conversion of the ADC 113, the magnitude of the data signal S113 at the node N12 (the output terminal of the ADC 113) is −26 dBFS, and the magnitude of the digital noise floor (DNF) at the node N12 is −91 dBFS. Thus, the signal-noise ratio (SNR) at the node N12 is 65 dB. Through the attenuator 114, the data signal S113 and the digital noise floor at the node N12 are attenuated by 20 dB (the attenuation value with 20 dB is represented by −20 dB in FIG. 2). Thus, the magnitude of the attenuated data signal S114 at the node N13 (the output terminal of the attenuator 114) is −46 dBFS, and the magnitude of the digital noise floor is −111 dBFS. Compared with −91 dBFS, the noise generated by the attenuator 114 and the modulator 116 is much lower. Thus, the magnitude of the output digital signal S116 at the output node N14 is still −46 dBFS, and the magnitude of the digital noise floor (DNF) at the output node N14 is still −111 dBFS. Accordingly, the signal-noise ratio (SNR) at the output node N14 is still 65 dB. In the embodiment, the output digital signal S116 with −46 dBFS is the signal which is derived from the acoustic signal 12 with 94 dBSPL passing through the processing path of the digital microphone 1. The digital noise floor (DNF) at the final output node N14 of the digital microphone 1, whose magnitude is −111 dBFS when the noise voltage signal S20 is −101 dBV, is the accumulated noise of the MEMS sensor 10 and all elements used to process the acoustic signal 12.

As described above, the controller 117 receives the amplified signal S112 and compares the magnitude of the amplified signal S112 with the reference value. When the controller 117 determines that the magnitude of the amplified signal S112 derived from the acoustic signal 12 is less than the reference voltage, the controller 117 generates a control signal S117A which is used to control the attenuator 115 in the analog domain to keep its attenuation value at 0 dB, a control signal S117C which is used to control the attenuator 114 in the digital domain to keep its attenuation value at 20 dB, and a control signal S117B which is used to control the bias generator 110 to keep bias voltage V110 at the predetermined level.

In the embodiment of FIG. 2 where the pressure level of the acoustic signal 12 is 94 dBSPL, the signal-noise ratio (SNR) at the node N12 is 65 dB, and the SNR at the output node N14 is also 65 dB. Thus, in the cases where an attenuator, such as the attenuator 114, is additionally coupled to the output terminal of the ADC 113 for processing the data signal in the digital domain, there is no change in SNR presented after the ADC 113.

Generally, a conventional MEMS digital microphone comprises a MEMS sensor, a charge pump (bias generator), a buffer, a preamplifier, and an ADC, but it does not comprise any attenuator, modulator, and/or controller for controlling signal attenuation and bias-voltage adjustment, such as the attenuators 114 and 115, the modulator 116, and the controller 117 proposed by the embodiment of FIG. 1. For the conventional MEMS digital microphone, the specification of the pressure level of the incoming acoustic signal at the input of the MEMS sensor is typically 94 dBSPL, and the magnitude of the signal at the output terminal of the ADC (that is, the output terminal of the conventional MEMS digital microphone) is −26 dBFS. In this case, the magnitude of the signal at the output terminal of the ADC will reach 0 dBFS which is the maximum value for the ADC when the pressure level of the incoming acoustic signal is 120 dBSPL. Since the conventional MEMS digital microphone does not comprise any processing block after the ADC, the conventional MEMS digital microphone cannot handle any incoming acoustic signal which is higher than 120 dBSPL.

In the embodiment, the direct-current (DC) bias at the node N10 is close to 0 V (volt). Thus, when a larger acoustic signal, such as an acoustic signal with 120 dBSPL, is transmitted to the MEMS sensor 10, the voltage signal S10 at the node N10 can pass through the following processing path without clipping. However, in the cases where a vary large acoustic signal, such as an acoustic signal with a level higher than 120 dBSPL, is transmitted to the MEMS sensor 10, if the bias voltage V10 is not lowered and the attenuation value of the attenuator 115 is equal to 0 dB, the level of the voltage signal S10 may reach a value higher than the safe operating point of the diodes coupled to the node N10. Generally, the node N10 has a diode which is biased by a voltage. If the diode is forward biased by 100 mV, for example, a leakage will flow through the diode. Thus, when the level of the voltage signal S10 reaches a value higher than the safe operating point of the diodes coupled to the node N10. The noise at the node N10 increases, and the SNR at the node N10 is degraded. Moreover, all the elements in the digital microphone 1 are powered by a linear regulator (LDO). If an incoming acoustic signal is very large, the related signals in the processing path may be clipped by the buffer 111 or the preamplifier 112. Thus, the digital microphone 1 is provided to process the acoustic signal 12 whose pressure level is higher than 120 dBSPL through lowering the bias voltage V110 and attenuating the voltage signal S10 at the node N10, so that the signals in all processing blocks in the analog domain is not clipped due to supply voltage constraint.

As described above, the controller 117 compares the magnitude of the amplified signal S112 with a reference value and determines the attenuation values of the attenuators 114 and 115 and the level of the bias voltage V110 according to the comparison result. In the cases where the bias voltage V110 is still at the predetermined level and the attenuation value of the attenuator 115 is equal to 0 dB, when the acoustic signal 12 whose pressure level is higher than 120 dBSPL is sensed by the MEMS sensor 10, the controller 117 determines that the magnitude of the amplified signal S112 derived from the acoustic signal 12 is larger than the reference value. At this time, according to the determination result, the controller 117 generates the control signal S117A to control the attenuator 115 in the analog domain to change/increase its attenuation value to 20 dB (the attenuation with 20 dB is represented by −20 dB in FIG. 3), the control signal S117C to control the attenuator 114 in the digital domain to change/decrease its attenuation value at 0 dB, and the control signal S117B to control the bias generator 110 to lower the bias voltage V110 to be lower by the predetermined level.

Figure 3:
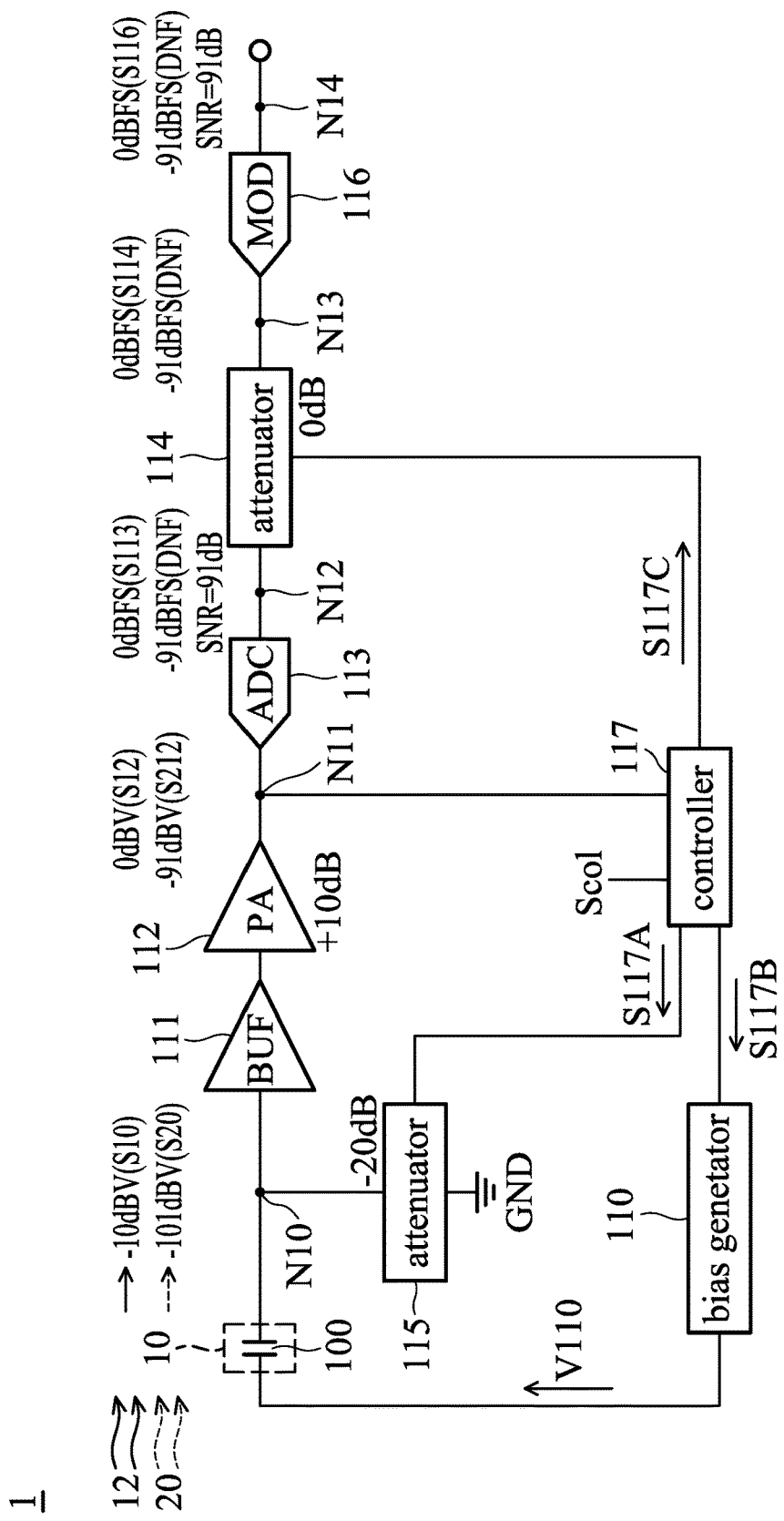
FIG. 3 is schematic view showing an operation of a digital microphone for an acoustic signal with a large SPL value.

Referring to FIG. 3, it is assumed that the acoustic signal 12 whose pressure level is higher than 120 dBSPL, such as 140 dBSPL, Since the bias voltage V110 is lowered and the attenuation value of the attenuator 115 is changed to 20 dB (the attenuation with 20 dB is represented by −20 dB in FIG. 3), after the transfer operation of the MEMS sensor 10, the magnitude of the voltage signal S10 at the node N10 is −10 dBV. Moreover, to describe the signal-noise ratio (SNR) of the digital microphone 1, the noise signal 20 is applied to serve as a reference signal, and it is assumed that the magnitude of the noise voltage signal S20 at the node N10, which is transferred from the noise signal 20, is −101 dBV. Through the operation of the preamplifier 112 whose gain is 10 dB, the magnitude the amplified signal S112 at the node N11 (the output terminal of the pre-amplifier 112) is −0 dBV, and the magnitude of the noise signal S212 at the node N11 is −91 dBV. In the embodiment, the gain of the ADC 113 is 0dB. Accordingly, after the analog-to-digital conversion of the ADC 113, the magnitude of the data signal S113 at the node N12 (the output terminal of the ADC 113) is 0 dBFS, and the magnitude of the digital noise floor (DNF) at the node N12 is −91 dBFS. Thus, the signal-noise ratio (SNR) at the node N12 is 91 dB. In the embodiment, since the attenuation value of the attenuator 114 is 0 dB, the magnitude of the attenuated data signal S114 at the node N13 (the output terminal of the attenuator 114) is also 0 dBFS, and the magnitude of the digital noise floor is also −91 dBFS. Compared with −91 dBFS, the noise generated by the attenuator 114 and the modulator 116 is much lower. Thus, the magnitude of the output digital signal S116 at the output node N14 is still 0 dBFS, and the magnitude of the digital noise floor (DNF) at the output node N14 is still −91 dBFS. Accordingly, the signal-noise ratio (SNR) at the output node N14 is still 91 dB. The digital noise floor (DNF) at the final output node N14 of the digital microphone 1, whose magnitude is −91 dBFS when the noise voltage signal S20 is −101 dBV, is the accumulated noise of the MEMS sensor 10 and all elements used to process the acoustic signal 12.

In the embodiment of FIG. 3 where the pressure level of the acoustic signal 12 is 140 dBSPL, the signal-noise ratio (SNR) at the node N12 is 91 dB, and the SNR at the output node N14 presented after the processing blocks coupled to the ADC 113 (such as the attenuator 114 and the modulator 116) is also 91 dB. Thus, there is no change in SNR represented after the ADC 113.

According to the above embodiments of FIGS. 2 and 3, the controller 117 can dynamically control the attenuation values of the attenuators 114 and 115 and the level of the bias voltage V110 according to the magnitude of the amplified signal S112 generated by the preamplifier 112. When a larger acoustic signal is transmitted to the MEMS sensor 10, the controller 117 controls the bias generator 110 to lower the bias voltage V110 for degrading the sensitivity of the MEMS sensor 10 and further controls the attenuator 115 to increase the attenuation value, so that a higher dynamic range can be achieved.

In another embodiment, the controller 117 further receives an adjustment signal Scol. When the adjustment signal Scol is enabled, the controller 117 controls the bias generator 110 to lower the bias voltage V110 10, controls the attenuator 115 to increase the attenuation value, and further controls attenuator 114 to decrease the attenuation value to 0 dB even though the controller 117 determines that the magnitude of the amplified signal S112 is less than the reference value. On the other hands, when the adjustment signal Scol is disabled, the controller 117 determines the attenuation values of the attenuators 114 and 115 and the level of the bias voltage V110 according to the comparison result related to the amplified signal S112.

According to the above embodiments, the digital microphone 1 can be configured to achieve high dynamic range by dynamically adjusting the bias voltage V110 and using two attenuators 114 and 115, one in analog domain and another in digital domain. When the MEMS sensor 10 senses a larger acoustic signal, the magnitude of the voltage signal S10 generated by the MEMS sensor 10 is lowered by using the lowered bias voltage V110 and the increased attenuation value. The smaller sensitivity will ensure that the signals S10, S111, and S112 in the subsequent processing blocks in the analog domain are not clipped and the peaks of these signals at any given time are not higher than the supply voltage. Accordingly, the distortion induced by the supply voltage limitation may not be caused in the signals in the analog domain. Thus, the dynamic range of the digital microphone 1 is increased for supporting a high AOP level.

Figure 4:
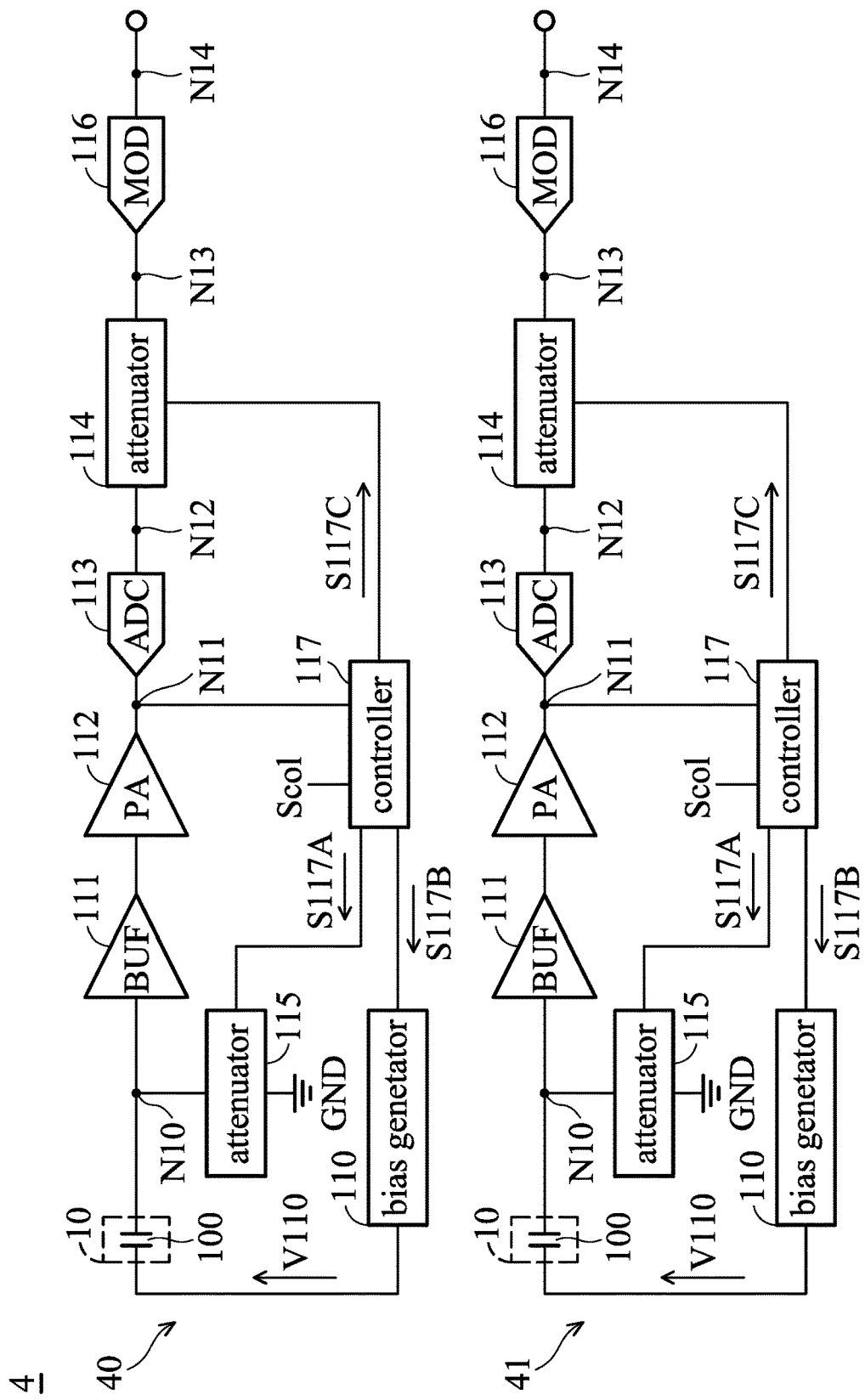
FIG. 4 shows an exemplary embodiment of a digital microphone system.

In an embodiment, the digital microphone 1 can be applied in a high definition (HD) application. As shown in FIG. 4, a digital microphone system 4 comprises two sensors 40 and 41. Each of the sensors 40 and 41 comprises the same structure of the digital microphone 1 of FIG. 1. Through the adjustment of the bias voltage V110 and the attenuation values of the attenuators 114 and 115, a weaker acoustic signal is processed by the sensor with stronger sensitivity, while a larger acoustic signal is processed by the sensor with weaker sensitivity. Accordingly, the dynamic range of the digital microphone system 4 is increased for supporting a high AOP level.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital microphone comprising:
    an acoustic sensor sensing an acoustic signal and transferring the acoustic signal to a voltage signal;
    a bias generator providing a bias voltage to the acoustic sensor;
    a first attenuator, coupled to the acoustic sensor at a first node, attenuating the voltage signal by a first attenuation value;
    a buffer, coupled to the acoustic sensor at the first node, receiving the voltage signal and buffering the voltage signal to generate a buffered voltage signal;
    an amplifier, connected to the buffer, receiving the buffered voltage signal and amplifying the buffered voltage signal to generate an amplified signal;
    an analog-to-digital converter, connected to the amplifier at a second node, receiving the amplified signal and converting the amplified signal to a data signal with a digital format;
    a second attenuator, connected to the analog-to-digital converter, attenuating the data signal by a second attenuation value; and
    a controller, connected to the amplifier at the second node, determining whether a magnitude of the amplified signal is larger than a reference value and adjusting the bias voltage, the first attenuation value of the first attenuator, and the second attenuation value of the second attenuator according to a determination result,
    wherein when the controller determines that the magnitude of the amplified signal is larger than the reference value, the controller controls the first attenuator to increase the first attenuation value, and further controls the second attenuator to decrease the second attenuation value.

2. The digital microphone as claimed in claim 1, wherein when the controller adjusts a level of the bias voltage to be lowered and the first attenuation value to be increased, the controller adjusts the second attenuation value to be decreased.

3. The digital microphone as claimed in claim 1,
    wherein when the acoustic signal has a first pressure level, the bias voltage is at a first level, the first attenuation value is a first value, and the second attenuation value is a second value larger than the first value, and
    wherein when the acoustic signal has a second pressure level larger than the first pressure level, the bias voltage is at a second level lower than the first level, the first attenuation value is a third value, and the second attenuation value is a fourth value less than the third value.

4. The digital microphone as claimed in claim 1, wherein the acoustic sensor is a microelectro-mechanical system (MEMS) sensor.

5. The digital microphone as claimed in claim 1, wherein sensitivity of the acoustic sensor is determined by a level of the bias voltage.

6. The digital microphone as claimed in claim 1, wherein when the controller determines that the magnitude of the amplified signal is larger than the reference value, the controller controls the bias generator to lower a level of the bias voltage.

7. The digital microphone as claimed in claim 1, wherein a signal-noise ratio (SNR) presented after the analog-to-digital converter is unchanged.

8. The digital microphone as claimed in claim 1, wherein the second attenuator attenuates the data signal by the second attenuation value to generate an attenuated data signal, and the digital microphone further comprises:
- a modulator converting the attenuated data signal from a pulse coded modulation (PCM) signal to a pulse density modulation (PDM) signal to generate an output digital signal at an output node of the digital microphone.

9. A control method for a digital microphone, comprising:
- providing a bias voltage to an acoustic sensor;
- transferring an acoustic signal to a voltage signal by the acoustic sensor;
- attenuating the voltage signal by a first attenuation value;
- amplifying the signal to generate an amplified signal according to the voltage signal;
- converting the amplified signal to a data signal with a digital format;
- attenuating the data signal by a second attenuation value;
- determining whether a magnitude of the amplified signal is larger than a reference value; and
- when it is determined that the magnitude of the amplified signal is larger than the reference value, increasing the first attenuation value and decreasing the second attenuation value.

10. The control method as claimed in claim 9, wherein according to the determination result, when the level of the bias voltage is lowered and the first attenuation value is increased, the second attenuation value is decreased.

11. The control method as claimed in claim 9,
- wherein when the acoustic signal has a first pressure level, the bias voltage is at a first level, the first attenuation value is a first value, and the second attenuation value is a second value larger than the first value, and
- wherein when the acoustic signal has a second pressure level larger than the first pressure level, the bias voltage is at a second level lower than the first level, the first attenuation value is a third value, and the second attenuation value is a fourth value less than the third value.

12. The control method as claimed in claim 9, wherein the acoustic sensor is a microelectro-mechanical system (MEMS) sensor.

13. The control method as claimed in claim 9, wherein sensitivity of the acoustic sensor is determined by the level of the bias voltage.

14. The control method as claimed in claim 9, further comprising:
- when it is determined that the magnitude of the amplified signal is larger than the reference value.

15. The control method as claimed in claim 9, wherein a signal-noise ratio (SNR) presented after the step of converting the amplified signal to the data signal is unchanged.

16. The control method as claimed in claim 9, further comprising:
- converting the attenuated data signal from a pulse coded modulation (PCM) signal to a pulse density modulation (PDM) signal to generate an output digital signal at an output node of the digital microphone.

* * * * *